United States Patent [19]
Costello et al.

[11] Patent Number: 5,047,821
[45] Date of Patent: Sep. 10, 1991

[54] TRANSFERRED ELECTRON III-V SEMICONDUCTOR PHOTOCATHODE

[75] Inventors: Kenneth A. Costello, Palo Alto; William E. Spicer, Stanford; Verle W. Aebi, Menlo Park, all of Calif.

[73] Assignee: Intevac, Inc., Santa Clara, Calif.

[21] Appl. No.: 494,044

[22] Filed: Mar. 15, 1990

[51] Int. Cl.[5] ...................... H01L 27/14; H01L 31/00; H01L 29/161; H01L 45/00

[52] U.S. Cl. .......................................... 357/30; 357/4; 357/16; 357/3; 357/32

[58] Field of Search ........................ 357/3, 4, 16, 30 B, 357/30 E, 30 L, 16

[56] References Cited

U.S. PATENT DOCUMENTS

| | | | |
|---|---|---|---|
| 3,958,143 | 5/1976 | Bell | 357/3 |
| 4,614,961 | 9/1986 | Khan et al. | 357/30 B |
| 4,751,423 | 6/1988 | Munter et al. | 357/3 |
| 4,903,090 | 2/1990 | Yokoyama | 357/16 |

OTHER PUBLICATIONS

"Field Assisted Semiconductor Photoemitters for the 1-2-μm Range", Escher et al, IEEE Transactions on Electron Devices, vol. ED-27, No. 7, Jul. 1980, pp. 1244-1250.

*Primary Examiner*—Rolf Hille
*Assistant Examiner*—Mahshid Saadat
*Attorney, Agent, or Firm*—Stanley Z. Cole; Sheri M. Novack; David Schnapf

[57] ABSTRACT

An improved transferred electron III-V semiconductor photocathode comprising an aluminum contact pad and an aluminum grid structure that improves quantum efficiency by removing a major obstacle to electrons escaping into the vacuum and controls dark spot blooming caused by overly bright photon emission sources.

19 Claims, 4 Drawing Sheets

10
12
14
16
hv
e
22
20
OPTICS
-
+
18

45 CONTACT PAD
BIAS
VACUUM 18
40 CONTACT PAD
12
10
SUBSTRATE
PHOTON ABSORPTION LAYER
ELECTRON EMITTING LAYER
METALLIZATION
ACTIVATION
hv
e
46
50
48
54
42
GRID
OPTICS
32
34
36
38
39
41
44

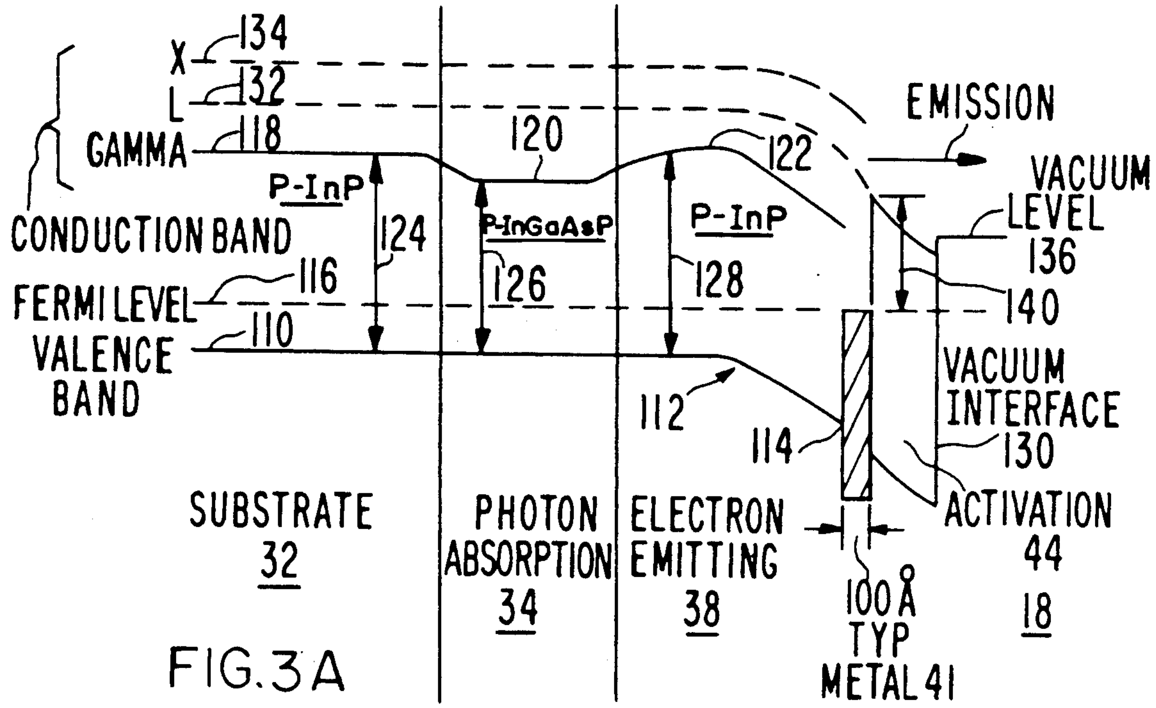
FIG.3A
FIG.3B
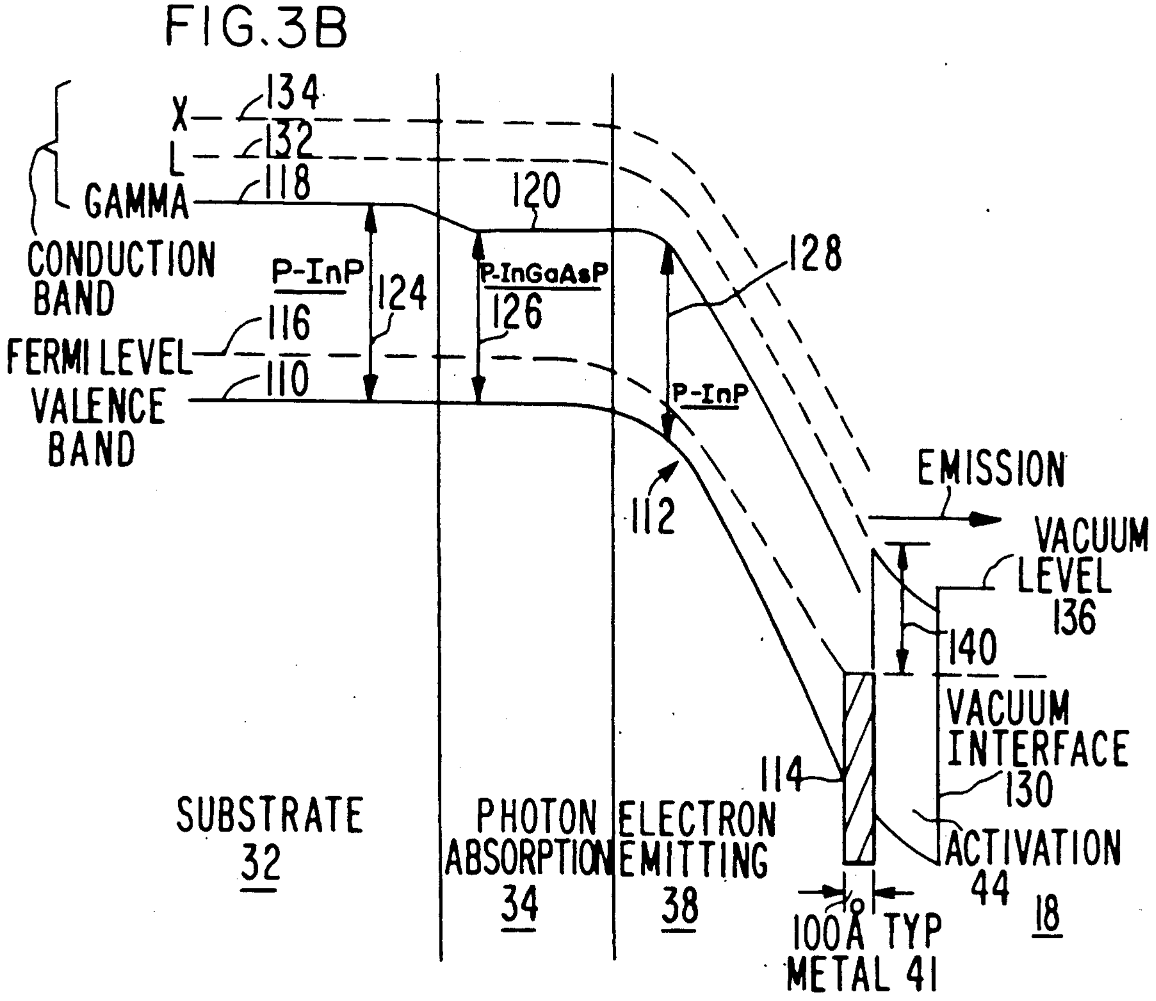

TRANSFERRED ELECTRON III-V SEMICONDUCTOR PHOTOCATHODE

BACKGROUND OF THE INVENTION

1. Field of the Invention

This invention pertains generally to III-V semiconductor devices (so called because one element is obtained from column III of the Periodic Table of Elements and the other from column V), and more particularly to transferred electron III-V semiconductor photocathode construction.

2. Description of the Prior Art

Semiconductor photocathodes are used in various light sensing applications. In a typical transmission photocathode, the backside of the photocathode emits electrons into a vacuum in response to photons (visible and infra-red light) incident on the front side of the photocathode. The efficiency of this production is the photocathode's quantum efficiency measure. In a simple diode device, the electrons that emit from, or escape, the surface of the photocathode into the vacuum are accelerated by an electric field and are attracted to and strike a phosphor target screen. The phosphor emits light in response to the incident electrons which may be of a different wavelength than the light incident on the photocathode.

Phonton absorption causes the electrons in the valence band of a photon absorbing layer of the photocathode to elevate to the lower valley (gamma valley) of the conduction band. The most efficient photocathodes used in modern light sensing and imaging applications are so called Negative Electron Affinity (NEA) photocathodes which rely on gamma valley transport of electrons almost exclusively.

Although NEA photocathodes have excellent sensitivities, their long wavelength response is limited to about 1000 nm by greatly reduced electron surface escape probabilities for semiconductors with bandgaps smaller than about 1.2 eV (wavelengths longer than 1000 nm). Work function and surface barrier effects at the vacuum-semiconductor interface limit the successful transport of photoexcited electrons into vacuum. In order to overcome the surface barrier effects in long wavelength photocathodes, various externally biased photocathodes have been studied over the years. Externally biased photocathodes can, in principle, extend the long wavelength cutoff by lowering the vacuum energy level relative to the Fermi level in the bulk photon-absorbing active layer. A number of p-n junction, MOS, field-emission, and heterojunction bias-assisted photocathodes have been proposed and experimentally studied, but none prior to the development of the transferred electron (TE) photocathode patented by Bell, U.S. Pat. No. 3,958,143 ('143), has shown reasonably efficient photoemission combined with the required low dark current emission to be of practical interest. A complete description of the principles of operation of the TE photocathode, together with a discussion of the limitations of NEA photocathodes, is found in Bell '143. The present invention belongs to the class of TE photocathodes.

In 1974, Bell, et al. demonstrated a bias-assisted p-InP photocathode using, for the first time, the mechanism of TE photoemission; "Transferred Electron Photoemission from InP," R. L. Bell, L. W. James, and R. L. Moon, 25 Appl. Phys. Lett. 645 (1974). TE photoemission is based on the fact that for certain III-V semiconductors, such as InP, InGaAsP alloys, and GaAs, electrons can be promoted to the upper conduction band valleys with reasonable efficiency by applying modest electric fields. Photogenerated electrons which successfully transfer to the upper valleys, or become hot gamma electrons, are then energetic enough to have a good probability of being emitted over the work function and surface energy barriers into vacuum. Following this initial result experimental high-performance TE photocathodes for the 1000 nm to 1650 nm region were extensively investigated; "Field-Assisted Semiconductor Photoemitters for the 1-2 μm Range," J. S. Escher, R. L. Bell, P. E. Gregory, S. B. Hyder, T. J. Maloney, and G. A. Antypas, IEEE Trans. Elec. Dev. ED-27, 1244 (1980).

In TE photocathodes, electrons are further elevated, or promoted, from the lowest energy states of the gamma valley of the conduction and to the upper satellite valleys (L or X) of the conduction band or to higher energy levels in the gamma valley. The promotion of electrons in a TE photocathode is accomplished by introducing an electric field of $10^4$ V/cm, or greater. (The field strength is a function of the doping of and the electrical bias on the semiconductor.) Because TE photocathodes rely on upper satellite valley transport almost exclusively, they are able to more readily overcome a higher threshold to escaping electrons. (This threshold is also called the "vacuum energy level.")

Various possible semiconductor materials have different bandgaps, i.e., the energy difference between their valence bands and conduction bands. On one hand, it may be desirable to choose a material with a larger bandgap, because the higher an energy an electron will jump to, the better is its probability of escaping into the vacuum. But on the other hand, large bandgap semiconductor materials require photons that have sufficient energy to cause the jump from the valence band to the now higher conduction band. The incoming photons must typically be shorter than 1000 nm in wavelength. Therefore, better electron emission comes at a cost of more limited photon wavelength sensitivity. The compromise that is often reached in NEA photocathodes is one where sensitivity to longer wavelength photons (e.g., infra-red) is achieved, at the cost of putting the sole transporting conduction band valley (e.g., gamma valley) just barely above the vacuum energy level. Because electron energy levels are so near the vacuum energy levels in NEA photocathodes, the escape probabilities of the electrons are significantly altered by small changes in the "work function" or surface barrier of the material at the photocathode to vacuum interface.

To escape the surface of a photocathode into a vacuum an electron must be sufficiently energetic to overcome the vacuum energy level. In an NEA photocathode the effective electron affinity for electrons in the gamma valley of the conduction band in the bulk material is determined by the work function at the semiconductor surface and the band binding of the semiconductor. Since the band gap region is typically no more than 100 Å wide, the electrons in the gamma valley can transport across the region as hot electrons with little or no loss in energy. Thus if the band gap is larger than the work function at the semiconductor surface, the electrons have a greater probability of reaching the surface with energy sufficient to overcome the work function and thus escape into the vacuum. Low work function metals and activation layers that reduce work function have therefore been preferred in photocathode use. (See, e.g., Bell, U.S. Pat. No. 3,644,770.)

In a TE photocathode, a bias is applied to develop an electric field in the semiconductor which, by the Transferred Electron Effect, promotes the electrons to higher energy levels as they are transported through the depletion region created by the bias. The energy imparted to the electrons by the electric field allows the electrons to have an energy that, as above, is greater than the work function and thus sufficient to see that the electrons escape into the vacuum. As is described by Bell '143, a simple Schottky barrier can be implemented between the semiconductor and the activation layer, using silver to allow the application of a bias voltage. The Schottky barrier height between the semiconductor and metal needs to be sufficient to prevent appreciable hole current from flowing from the metal into the semiconductor. A large hole current would prevent application of sufficient bias to the semiconductor due to IR drops in the thin metal layer, in addition to introducing noise via the electron/hole pair creation associated with the hole current. In the prior art, the metal is uniformly applied over the whole electron emitting surface of the photocathode to allow application of a uniform bias to the semiconductor and to provide a return path for electrons that do not escape into the vacuum. Any such metal layer, however, will block some electrons from escaping because the electrons must first pass through the metal, and the electrons that are blocked add to the return current. The metal of choice has been silver, because of its ability to obtain a low work function surface by applying an activation layer of cesium and oxygen to the silver surface and its high conductivity. (Such activation lowers the work function of the metal to about 1.0 eV using Ag as the metal.) In a TE photocathode, use of silver is described by Bell '143 as his preferred embodiment.

Some TE semiconductor photocathodes are constructed of a semiconductor photon absorbing layer, a separate semiconductor electron emitting layer, with a heterojunction being formed between the two layers. In other TE semiconductor photocathodes a single semiconductor layer is used both as the photon absorbing layer and as the electron emitting layer. In either case, as is well known, the dark current for the photocathode, i.e., the current that flows in the absence of light photons, will be minimized if the proton absorbing layer is constructed of P-type material.

If non-escaping electrons were allowed to collect at a point on the surface, a charge sufficient to "bias off" the surface in the vicinity of the excess electrons would occur, and no electrons would escape thereafter. A metallization layer serves to provide a return path for these surface electrons in addition to providing a way to uniformly bias the photocathode allowing an efficient transfer of electrons from the gamma to the upper satellite valleys of the conduction band. A tradeoff must be made, however, in the metallization layer so that it is thick enough to be sufficiently conductive, given the operating conditions of the device, and yet thin enough to not present too great an obstacle to electron emission. Silver is, in general, a very "transparent" material to escaping electrons compared to other metals, but when deposited on a semiconductor surface, silver tends to clump and form islands that can only be overcome by applying a thicker layer. The advantage of silver as a high electron transparency medium is therefore lost. The net result is such a thick layer of silver must be applied that as much as 90% of the electrons produced for emission collide with the silver's atomic structure and are thereby too degraded in energy to escape. Again, those electrons not escaping must be collected and conducted away from the photocathode surface.

Another problem with prior art TE photocathodes occurs when a large flux of photons incident on a small region of a TE photocathode creates a large population of promoted electrons. While it is generally desirable to have the thinnest possible metallization layer, a very thin metallization layer exhibits relatively large resistance, which, in turn, causes the well known problem of "blooming," i.e., although the large flux of input photons is confined to a small region, a much larger region is affected. While blooming is usually understood to be the growth of a white spot on a phosphor screen, blooming in a TE photocathode causes just the opposite effect: a dark spot on a phosphor display screen will grow as the photocathode is biased-off by the large population of electrons at the photocathode surface. Since more than half of the electrons produced for emission can wind up having to be returned by the metallization layer, a large IR (current x resistance) drop will form between the spot and a device's contact pad, i.e., the point on the periphery of the photocathode where the bias voltage is applied. Prior art devices exhibit a congestion of electrons on the return path, and electrons accumulate and involve a much larger area than was initially involved. In the worst case, this congestion can bloom over the entire photocathode surface and the accumulated charges will bias-off the device completely. This phenomenon is also known in the art as "photoresponse loss."

Another practical disadvantage of the prior art is the difficulty in forming a reliable mechanical contact in a tube assembly to the contact pad and extremely thin Schottky barrier, which is required for efficient electron transmission. The electrical contact at the contact pad is likely to be intermittent if the thin metal layer is directly penetrated by the contact probe. Penetration of the metal layer is also likely to result in high field regions in the contact area resulting in unacceptably high leakage currents which will effectively shunt the Schottky barrier.

It has been determined that aluminum has very favorable heat clean thermal stability characteristics making it an excellent choice for a relatively thick contact pad applied directly to the semiconductor surface, since the post heat clean leakage currents remain low for the resulting Schottky barrier. The inventors have experimented and researched several other metals and have not found any alternatives which will survive heat clean, while maintaining a good Schottky barrier. Moreover, aluminum's ability to survive heat clean allows the creation of a grid structure, described below, by photolithography directly on the semiconductor surface. Previous art required the evaporation of thick contact pads after the heat clean step had been completed. This introduced the added complexity of thick UHV metal depositions accurately positioned on the photocathode surface. The unusual properties of aluminum include the ability to maintain a Schottky barrier on InP even after the thermal cycle associated with a heat clean, and the ability to survive the chemical processing associated with the final chemical clean (which is required prior to heat clean of the photocathode).

Because aluminum exhibits excellent thermal stability properties, it may be patterned using photolithography techniques into a grid structure prior to final chemical and heat clean of the semiconductor surface prior to activation of the photocathode. The grid structure could then simultaneously contain photoresponse losses and improve quantum efficiency.

SUMMARY OF THE PRESENT INVENTION

It is an object of the present invention to improve the quantum efficiencies in TE III-V semiconductor photocathodes.

It is a further object to cure the area blooming associated with a loss of photoresponse. The sure will minimize the areas thus affected and improve the recovery times of areas of the photocathode that have succumbed to a photoresponse loss.

It is a further object to form a relatively thick, thermally stable, and reliable mechanical contact to the thin Schottky barrier metal layer that will not be penetrated by a contact probe.

It is a further object to enable the use of low work function Schottky barriers that could not heretofore be used because of their high surface resistivity to return currents.

It is a further object to apply the contact pad and grid metallization layers before heat clean whereby they may be formed into structures that may improve the quantum efficiency and the photoresponse by reducing the required metallization thickness of the layer which provides the uniform bias to the semiconductor.

Briefly, the present invention, in a first preferred embodiment, is comprised of III-V semiconductor materials including a p-type substrate, a p-type photon absorption layer, an electron emitting layer, a resulting heterojunction, a contact pad, a metallization layer, a resulting Schottky barrier, and an activation layer. The contact pad is made of aluminum to one side of an electron emission surface. The metallization layer may be formed in the shape of a grid, and is also made of aluminum. It is distributed over the entire emission area and it and the contact pad are overlaid by an optional additional metallization layer and by the activation layer. Either the optional metallization layer, or if not used, the activation layer forms a Schottky barrier with the semiconductor. A second preferred embodiment of the present invention is the same as the first, except that the photon absorption and electron emission occurs in a single layer and there is therefore no interposed heterojunction. A third embodiment does away with the need to have Schottky barriers under the contact pad and grid metallization layers by interposing insulating layers over where the Schottky barriers would otherwise have been found.

An advantage of the present invention is that the grid provides a more efficient return path on the surface of the photocathode, thereby containing the involvement of areas experiencing a photoresponse loss.

Another advantage is that the grid blocks only a small percentage of the surface area of the photocathode with its grid lines which compares very favorably with the much larger percentage loss caused by covering the surface with a uniform coat of silver or other metal. Large improvements in photocathode quantum efficiency are possible, meaning higher output thresholds and more sensitive input thresholds.

Another advantage of the present invention is an alternative now presented to the previous necessity of trading IR drop across a metallization layer with the thickness of the metallization layer, so that a much thinner Schottky barrier layer may be used to provide a uniform bias on the surface of the photocathode.

Another advantage of the present invention is that the aluminum of the contact pad will not go "ohmic" causing intermittent contact problems. The Schottky barrier height at the contact pad and the grid, after heat clean, settles to about 0.82 eV, which keeps hole emission over the barrier to an acceptably low level. The aluminum also survives chemical cleans well and is easy to deposit with existing equipment.

These and other objects and advantages of the present invention will no doubt become obvious to those of ordinary skill in the art after having read the following detailed description of the preferred embodiment which are illustrated in the various drawing figures.

BRIEF DESCRIPTION OF THE DRAWINGS

FIGS. 3A and 3B are energy band diagrams of a TE III-V semiconductor photocathode, FIG. 3A shows the case of no bias is being applied to the photocathode and FIG. 3B showing the case when there is a bias applied.

DESCRIPTION OF THE PREFERRED EMBODIMENTS

Figure 1:
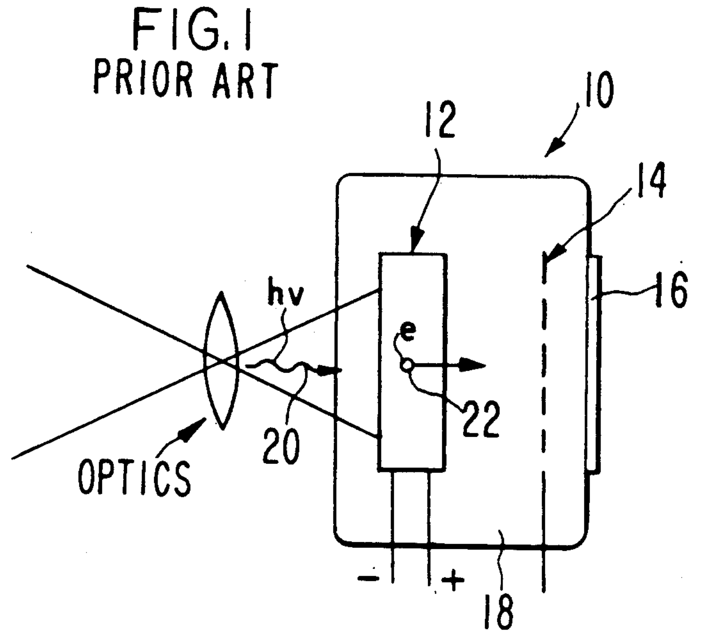
FIG. 1 PRIOR ART
FIG. 1 is a schematic of a tube containing a TE III-V semiconductor photocathode.

Referring now to FIG. 1, there is shown a simple diode device, of the type which is generally known in the prior art, consisting of an evacuated tube 10 comprised of a photocathode 12, an anode 14, and a phosphor screen 16, all within a vacuum 18. As a practical matter, the phosphor screen 16 and anode 14 form an integral unit comprising an aluminum layer deposited on a commercially available phosphor. A photon 20 triggers the production of an electron 22 within photocathode 12. The electron 22 enters the vacuum 18, is attracted by anode 14 toward the phosphor screen 16 causing light emission.

Figure 2:
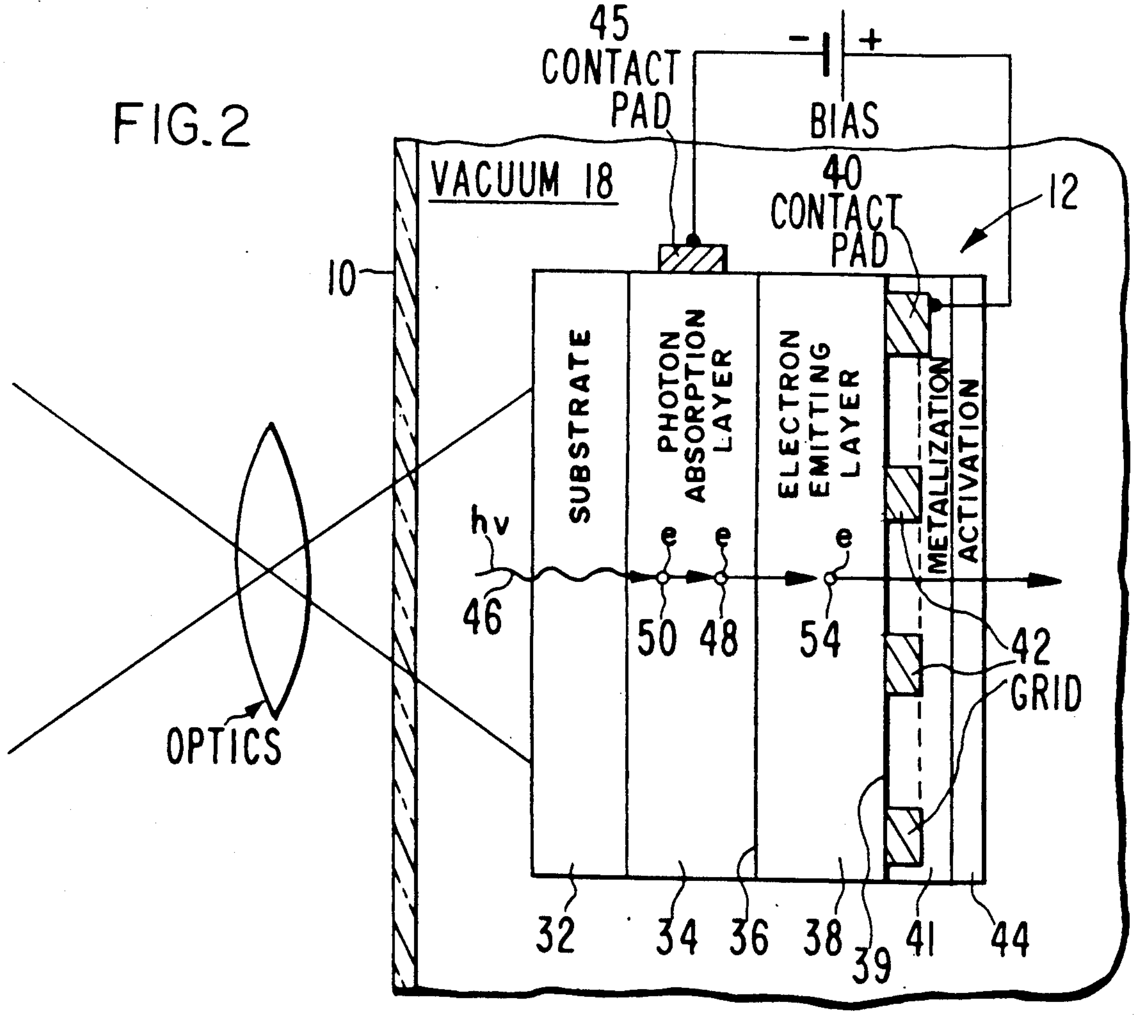
FIG. 2 is a cross-section of a TE III-V semiconductor photocathode of the present invention.

FIG. 2 is a detailed representation of a first preferred embodiment the photocathode 12 of the present invention. Such a photocathode may be employed in the diode of FIG. 1, for example. Photocathode 12 is comprised of a substrate 32, a photon absorption layer 34, a heterojunction 36, an electron emission layer 38, a Schottky barrier 39, a first contact pad 40, a metallization layer 41, a grid 42, an activation layer 44, and a second contact pad 45. The heterojunction 36 is formed between the electron emission layer 38 and the photon absorption layer 34. A photon 46 is absorbed in layer 34 producing a conduction band electron 48 from a valençe band electron 50. An electric field created by a bias voltage on the photocathode 12, applied as shown between first contact pad 40 (+) and second contact pad 45 (−), promotes electron 48 to a more energetic, upper satellite valley electron 54 which escapes into vacuum 18. The bias voltage, which is applied to the contact pads 40 and 45, metallization layer 41, and grid 42, is responsible for the creation of a depletion zone that extends from the Schottky barrier 39 to at least the heterojunction 36.

The substrate 32 is essentially transparent to the photons of interest, and is nominally 16 mils thick in a preferred embodiment. In the case of an InP based TE photocathode the photon absorption layer 34 is p-type material, doped $1\times10^{15}$ cm$^{-3}$ to $1\times10^{18}$ cm$^{-3}$, and is 200 nanometers to 2,000 nanometers thick. The thinner photon absorption layer 34 is, the faster will be the time response, but by thickening it a greater proportion of the incoming photons can be absorbed resulting in better quantum efficiency, assuming that the incremental gain in optical absorption is not offset by diffusion losses.

Higher doping levels improve the dark current in the case where the absorption layer is not completely depleted. The electron emitting layer 38 can be either n-type or p-type, with doping less than $1\times10^{17}$ cm$^{-3}$, and a thickness in the range of 200 nanometers to 1,000 nanometers.

In a second preferred embodiment of the present invention, there is but a single semiconductor layer that replaces the function of and eliminates the photon absorption layer 34, the heterojunction 36, and the electron emission layer 38 (all of FIG. 2). A principal difference between the first and the second preferred embodiments is that the second is less expensive to manufacture because the device fabrication is simplified.

In another embodiment of the present invention, there is deposited an insulating layer (not shown) under first contact pad 40 and grid 42. The insulating layer prevents hole current from flowing from the first contact pad 40 and the grid 42 into the semiconductor, which was a primary objective of forming a Schottky barrier 39 when they are grown directly on the semiconductor. A Schottky barrier 39, however, still exists in the presence of a contact between the activation layer 44, or metallization layer 41, with the electron emission layer 38. However, this third embodiment involves increased expense and complexity in manufacturing incurred by depositing the required insulating layers, and the difficulty in obtaining the clean surface required on the electron emitting layer after deposition and patterning of the insulating layer. Even so, the other advantages of the first two embodiments are nevertheless obtained by the same mechanisms that are described here.

In each of the embodiments, the grid structure 42 of the present invention, obstructs only a few percent of the photocathode 12 surface, and that allows the use of a very thin metallization layer 41 to form the Schottky barrier 39 over the other regions of the photocathode. The Schottky barrier-type metallization layer 41 can be very thin, because the grid 42 serves the function of providing most of the return path for non-emitted electrons. In applications where the photon 46 flux input is low, the cesium/cesium oxide, or other low work function activation layer 44 has sufficient conductivity without the metallization layer 41 and forms an adequate Schottky barrier 39 to serve this purpose. In applications with higher photon input, the metallization layer 41 may be added beneath the activation layer. However, even in this situation, the layer 41 may be much thinner than was required in prior art devices without the grid 42. One of several metals, including palladium, can be deposited as metallization layer 41 in very thin layers, and would have adequate conductivity and form a sufficient Schottky barrier to ensure that layer 41 will provide a uniform biasing of the photocathode.

Energy band diagrams of the photocathode 12 of FIG. 2 are shown in FIGS. 3A and 3B. The photocathode 12, in its unbiased condition, is shown in FIG. 3A. Referring now to FIG. 3A, there is a substrate 32 of p-InP material, overlaid by a photon absorbing layer 34, which is in turn overlaid by an electron emitting layer 38, an overlying metallization layer 41, and overlying all the forgoing, an activation layer 44. The valence band 110 forms a bend 112 to contact the metallization layer 41, grid 42, and activation layer 44 at a point 114. The bend 112 is caused by (1) the presence of metal (e.g., 41, 42, & 44), (2) doping within the electron emitting layer 38, and (3) an electric field. The bend 112 continues across to the activation layer 44. A Fermi Level 116 is established by the bulk semiconductor material of the substrate 32 and is at a higher electron energy state than the valence band 110. Above the Fermi Level 116 is a gamma valley 118, which is a lower valley in the conduction band. The gamma valley 118 has a dip 120 in the region of the photon absorbing layer 34, which has a smaller bandgap than the substrate, and a hump 122 is the electron emitting layer 38. The hump 122 will prevent electrons excited only to the gamma valley 120 of the photon absorption layer 34 from migrating to a vacuum interface surface 130. In FIG. 3B, which shows the photocathode 12 of FIG. 2 in its biased condition, the hump 122 is eliminated by the application of a bias, and an acceleration field is thus formed through the electron emitting layer 38. The acceleration field is responsible for the promoting of the electron 48 to the higher energy electron 54.

A first bandgap 124 in the substrate 32, which is the energy difference in electron volts (eV) between the valence band 110 and the gamma valley 118, reduces to a smaller, second bandgap 126 in the photon absorbing layer 34. A third bandgap 128 is larger than the second bandgap 126. An L-type valley 132 and an X-type valley 134 represent the upper satellite valleys of a conduction band.

A vacuum energy barrier 136 exists at the vacuum interface surface 130 that will prevent the emission of electrons from the conduction bands having less energy than the vacuum energy barrier 136 level.

In FIG. 2, the photon 46 passes through the substrate 32 into the photon absorbing layer 34 and is absorbed by an atom (not shown) causing valence band electron 50 to become gamma valley electron 48. Gamma valley electron 48 is promoted by the electric field (not shown) to electron 54 which is energized to the L-type valley (132 in FIGS. 3A & 3B) or the X-type valley (134 in FIGS. 3A & 3B). Electron 54 is then at a higher energy level than the vacuum level (136 in FIG. 3) and can escape into vacuum 18 through the vacuum interface (130 in FIG. 3).

Figure 4A:
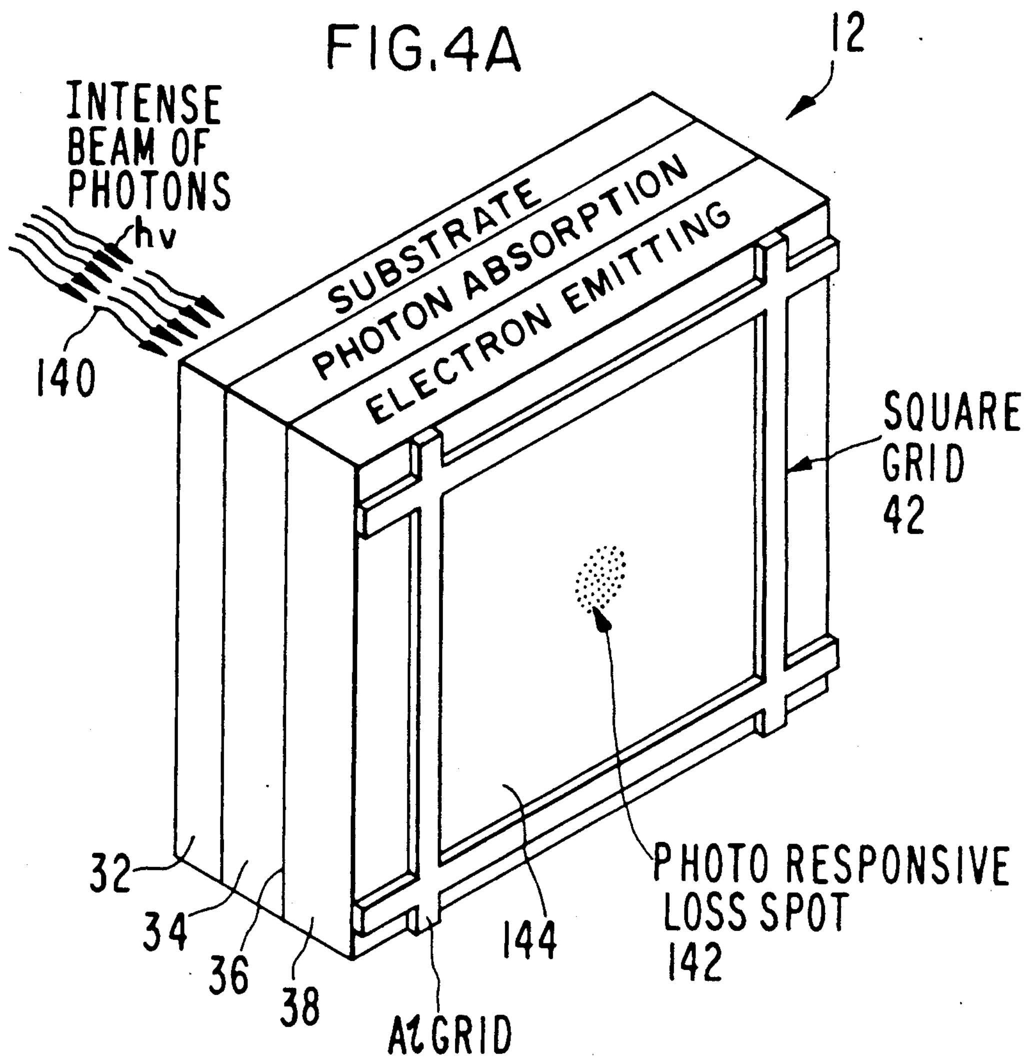
FIGS. 4A and 4B are (1) an isometric projection of a portion of a TE III-V semiconductor photocathode including the present invention, and (2) a diagram that details the circular spoke design of the grid in a preferred embodiment.
Figure 4B:
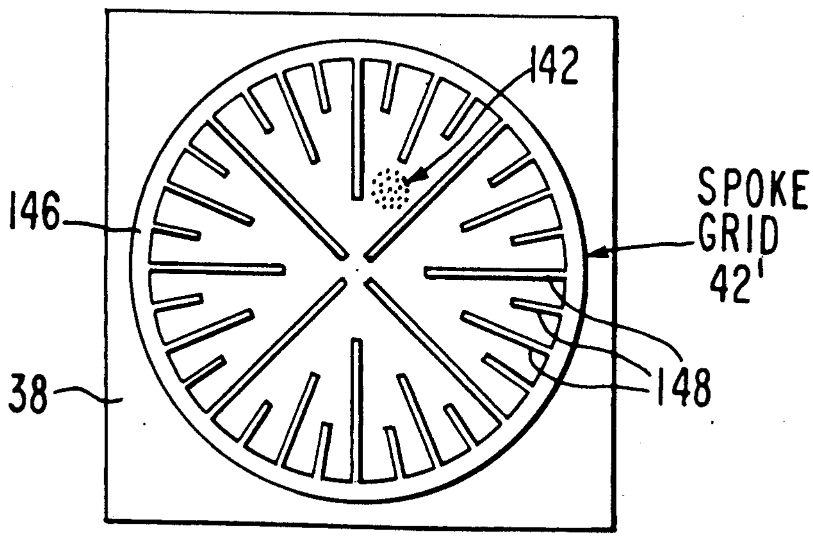

In FIG. 4A, the photocathode 12 is experiencing an intense incidence of photons 140 in a small region of the photocathode. (For clarity of the following discussion only, neither FIG. 4A nor FIG. 4B show the metallization layer 41 or the activation layer 44 that overlay the surface of the photocathode 12, because they would otherwise obscure the view of the grid 42.) A plurality of electrons 142 are emitted and cause a voltage drop at the surface of the electron emitting layer 38 in the region. The graphs in FIGS. 5A and 5B plot the voltage at the surface versus distance from a grid line, respectively, for the prior art photocathode with only a silver metallization (as shown in Bell '143) and the present invention (as represented in FIG. 4A) which includes an aluminum grid.

Figure 5A:
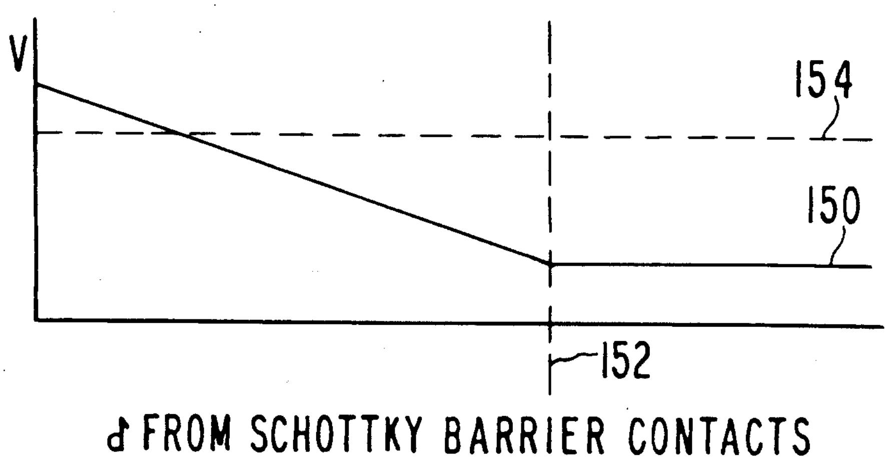
FIG. 5A PRIOR ART
FIGS. 5A and 5B are voltage versus distance graphs of (1) the surface of a prior art photocathode in FIG. 5A, and (2) a photocathode incorporating the present invention in FIG. 5B.
Figure 5B:
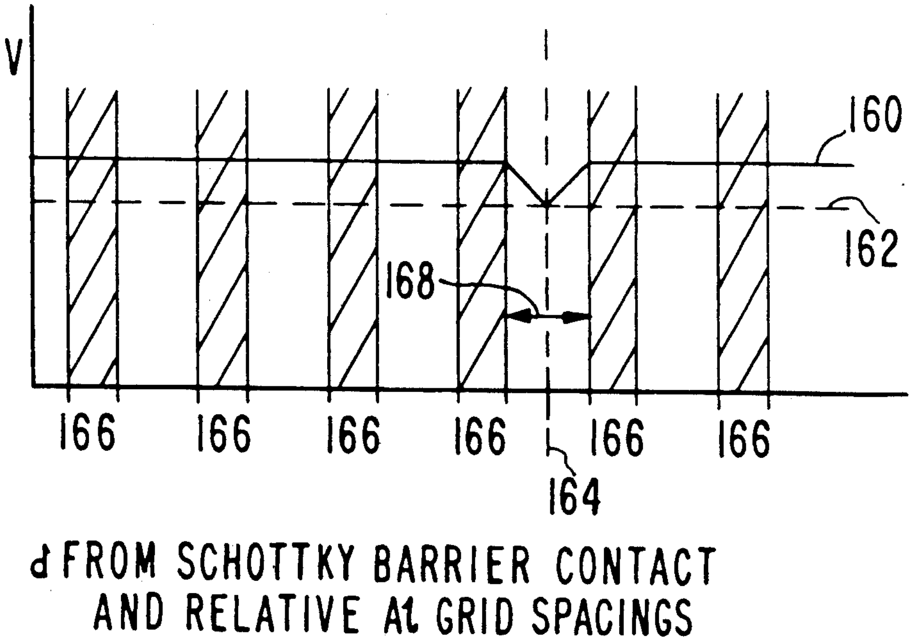

In FIG. 5A (prior Art), a voltage profile 150 is pulled down by the photoresponse loss point 152. An IR drop represented by the slope of voltage profile 150 develops such that all surface points beyond the intersection of a bias voltage 154 are biased off and will no longer allow electron emission into the vacuum. In the case of the present invention, as shown in FIG. 5B, a much smaller portion of a voltage profile 160 dips below a bias voltage 162 at a photoresponse loss point 164. A plurality of aluminum grid lines 166 (similar to grid 42's lines) are proximately closer than the first contact pad 40 and very much more conductive on the emission surface area than a prior art metallization layer. Photoresponse losses that extend beyond a peripheral grid line are eliminated, and the size of the loss is thus limited to a grid spacing distance 168.

FIG. 4B diagrams a circular spoke grid 42' that differs from grid 42 in FIG. 4A by its shape. The circular spoke grid consists of an outer ring 146 and a plurality of spokes 148. The function is the same, but in FIG. 4B the spokes 148 do not intersect, and all connect to the outer ring 146, which, in turn connects to the contact pad 40. The circular spoke grid represented in FIG. 4B is believed by the inventors to be more readily dried of cleaning chemicals by spinning, than is the square grid represented in FIG. 4A and is therefore preferred.

Although the present invention has been described in terms of several embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A transferred electron III-V semiconductor photocathode comprising:
- a p-type III-V semiconductor layer, for emitting electrons in response to a photon flux input;
- a grid mesh formed over the exposed surface of the p-type III-V semiconductor layer;
- an activation layer formed on the remaining exposed surface of the semiconductor layer lowering the work function of the semiconductor layer;
- a Schottky barrier formed between the activation layer and the semiconductor layer.

2. A transferred electron III-V semiconductor photocathode comprising:
- a photon absorbing layer of p-type III-V semiconductor material, for emitting electrons in response to a photon flux input;
- an electron emitting layer of III-V semiconductor material grown on a surface of the photon absorbing layer thereby forming a heterojunction at an interface;
- a contact pad having a thickness sufficient to provide a low resistance return path for the non-emitted electrons, said contact pad consisting of a metal which formed over the electron emitting layer, on a first portion at the periphery of an exposed surface of the electron emitting layer;
- a conductive grid mesh formed over the exposed surface of the electron emitting layer in electrical contact with the contact pad;
- an activation layer in electrical contact with the grid mesh, formed on the remaining exposed surface of the electron emitting layer lowering the work function of the semiconductor layer;
- a Schottky barrier formed between the activation layer and the electron emitting layer.

3. The transferred electron III-V semiconductor photocathode of claim 1 further including:
- a metallization layer which is interposed between the activation layer and the surface formed by the combination of the III-V semiconductor layer and the grid mesh.

4. The transferred electron III-V semiconductor photocathode of claim 2 further including:
- a metallization layer which is interposed between the activation layer and the surface formed by the combination of the electron emitting layer and the grid mesh.

5. The transferred electron III-V semiconductor photocathode of claim 2 wherein:
- the photon absorbing layer is comprised of InGaAsP;
- the electron emitting layer is comprise of InP; and
- the grid mesh and the contact pad are comprised of aluminum.

6. The transferred electron III-V semiconductor photocathode of claim 2 wherein:
- the grid mesh is made of aluminum and radiates from a circular contact pad, said grid comprising spokes converting from the circular contact pad and converging on the center, but ending before any spoke intersects another spoke.

7. The transferred electron III-V semiconductor photocathode of claim 6 wherein:
- the line width of the aluminum grid is normally 3 micrometers and the spacing between grid lines is in the range between 40 micrometers and 350 micrometers.

8. The transferred electron III-V semiconductor photocathode of claim 6 wherein:
- the aluminum grid mesh is rectangular or square in shape with crisscrossing and intersecting horizontal and vertical grid lines.

9. The transferred electron III-V semiconductor photocathode of claim 8 wherein:
- the line width of the aluminum grid is nominally 3 micrometers and the spacing between grid lines is as small as 40 micrometers and as large as 350 micrometers;
- whereby the masking of the electron emitting layer is minimized.

10. A transferred electron III-V semiconductor photocathode comprising:
- a layer of III-V semiconductor material which emits electrons in response to a photon flux input;
- a Schottky barrier layer overlaying said semiconductor layer;
- a relatively thick aluminum contact pad deposited directly on a peripheral portion of the layer of III-V semiconductor material, the aluminum contact pad forming a portion of the Schottky barrier layer; and
- a means to promote the energy of electrons in the layer of III-V semiconductor material from the gamma valley of the conduction band to the upper satellite valleys of the conduction band whereby electrons thus promoted are sufficiently energetic to escape into a vacuum.

11. The transferred electron III-V semiconductor photocathode of claim 1 wherein:

the grid mesh is formed directly on the exposed surface of the p-type III-V semiconductor layer which results in a Schottky barrier formation.

12. The transferred electron III-V semiconductor photocathode of claim 2 wherein:

the contact pad is formed directly on the electron emitting layer which results in a Schottky barrier formation; and, the grid mesh is formed directly on the exposed surface of the electron emitting layer which results in a Schottky barrier formation.

13. The transferred electron III-V semiconductor photocathode of claim 5 wherein:

the photon absorbing layer has a thickness in the range between 200 nanometers and 2,000 nanometers and has a doping for p-type material in the range between $1\times10^{15}\ cm^{-3}$ and $1\times10^{18}\ cm^{-3}$;

the electron emitting layer has a thickness in the range between 200 nanometers and 1,000 nanometers and has a doping for p-type or n-type material of less than $1\times10^{17}\ cm^{-3}$.

14. The transferred electron III-V semiconductor photocathode of claim 11 wherein:

the grid mesh is comprised of aluminum which results in a thermally stable Schottky barrier.

15. The transferred electron III-V semiconductor photocathode of claim 12 wherein:

the grid mesh is comprised of aluminum which results in a thermally stable Schottky barrier.

16. The transferred electron III-V semiconductor photocathode of claim 1 wherein said grid mesh has a surface area sufficiently small so as to minimize the fraction of electrons physically blocked by said grid, while still providing an efficient return path for the collected non-emitted photoelectrons.

17. The transferred electron III-V semiconductor photocathode of claim 10 wherein said Schottky barrier layer is formed by a metallization layer overlying said III-V semiconductor material.

18. The transferred electron III-V semiconductor photocathode of claim 17 further comprising an activation layer overlying said metallization layer.

19. The transferred electron III-V semiconductor photocathode of claim 10 wherein said Schottky barrier layer comprises an activation layer overlying said III-V semiconductor material.

* * * * *